(12) United States Patent
Conway

(10) Patent No.: US 8,935,142 B2
(45) Date of Patent: Jan. 13, 2015

(54) SIMULATION OF COMMUNICATION NETWORKS

(75) Inventor: Adrian E. Conway, Weston, MA (US)

(73) Assignee: Verizon Patent and Licensing Inc., Basking Ridge, NJ (US)

( * ) Notice: Subject to any disclaimer, the term of this patent is extended or adjusted under 35 U.S.C. 154(b) by 1340 days.

(21) Appl. No.: 12/403,151

(22) Filed: Mar. 12, 2009

(65) Prior Publication Data

US 2010/0232299 A1 Sep. 16, 2010

(51) Int. Cl.
| | |
|---|---|
| G06F 17/50 | (2006.01) |
| G06G 7/62 | (2006.01) |
| G06F 9/44 | (2006.01) |
| G06F 13/10 | (2006.01) |
| G06F 13/12 | (2006.01) |
| H04L 12/24 | (2006.01) |
| G06F 11/26 | (2006.01) |
| H04J 3/14 | (2006.01) |

(52) U.S. Cl.
CPC .......... *H04L 41/0681* (2013.01); *H04L 41/145* (2013.01); *G06F 17/509* (2013.01); *G06F 17/50* (2013.01); *G06F 13/105* (2013.01); *G06F 11/261* (2013.01); *H04J 3/14* (2013.01); *H04L 41/142* (2013.01)
USPC ............................................. 703/13; 703/21

(58) Field of Classification Search
CPC ..... G06F 17/50; G06F 17/509; G06F 11/261; G06F 13/105
USPC ...................................................... 703/13, 21
See application file for complete search history.

(56) References Cited

U.S. PATENT DOCUMENTS

| | | | | |
|---|---|---|---|---|
| 6,754,192 | B2* | 6/2004 | Kennedy | 370/331 |
| 7,284,146 | B2* | 10/2007 | Guimbellot et al. | 714/1 |
| 7,362,709 | B1* | 4/2008 | Hui et al. | 370/237 |
| 7,426,554 | B2* | 9/2008 | Kennedy | 709/223 |
| 7,830,813 | B1* | 11/2010 | Lo et al. | 370/252 |
| 7,916,657 | B2* | 3/2011 | Doverspike et al. | 370/252 |
| 2003/0172150 | A1* | 9/2003 | Kennedy | 709/224 |

OTHER PUBLICATIONS

Meera Balakrishnan, "Characterizing a Lumping Heuristic for a Markov Network Reliability Model", IEEE 1993.*
Ambuj Goyal,, "A Unified Framework for Simulating Markovian Models of Highly Dependable Systems", IEEE 1992.*

(Continued)

*Primary Examiner* — Omar Fernandez Rivas
*Assistant Examiner* — Angel Calle

(57) ABSTRACT

A computer-implemented method may include receiving transition information indicative of transition rates associated with a plurality of communication links in a network, wherein the network includes a plurality of nodes, the plurality of communication links, and a communication path between a first node and a second node of the plurality of nodes. In one embodiment, the communication path uses at least two of the plurality of communication links. The method may include generating biased transition information indicative of biased transition rates, wherein the biased transition rates are greater or less than the indicated transition rates and simulating the network, based on the biased transition information, until a transition associated with one of the communication links causes the communication path to transition to a different state. A network reliability parameter may be determined based on the simulation of the network.

25 Claims, 7 Drawing Sheets

(56) References Cited

OTHER PUBLICATIONS

Andrew, Lachlan L. H., "Fast Simulation of Wavelength Continuous WDM Networks," IEEE/ACM Transactions on Networking, vol. 12, No. 4, pp. 759-765, Aug. 2004.

Goyal, Ambuj, et al., "A Unified Framework for Simulating Markovian Models of Highly Dependable Systems," IEEE Transactions on Computers, vol. 41, No. 1, pp. 36-51, Jan 1992.

Song, Lei, et al., "On the Study of Multiple Backups and Primary-Backup Link Sharing for Dynamic Service Provisioning in Survivable WDM Mesh Networks," IEEE Journal on Selected Areas in Communications, vol. 26, No. 6, pp. 84-91, Aug. 2008.

Madden, Samuel, et al., "Mesh Networking Research and Technology for Multihop Wireless Networks," IEEE Computer Society, pp. 9-11, Jul./Aug. 2008.

Lang, Jonathan P., et al., "Mesh Network Resiliency Using GMPLS," Proceedings of the IEEE, vol. 90, No. 9, pp. 1559-1564, Sep. 2002.

Naser, Hassan, et al., "Availability Analysis and Simulation of Mesh Restoration Networks," Ninth IEEE Symposium on Computers and Communications, vol. 2, pp. 779-785, Jun. 2004.

Zhang, Jing, et. al., "Availability-Aware Provisioning Strategies for Differentiated Protection Services in Wavelength-Convertible WDM Mesh Networks," IEEE/ACM Transactions on Networking, vol. 15, No. 5, pp. 1177-1190, Oct. 2007.

\* cited by examiner

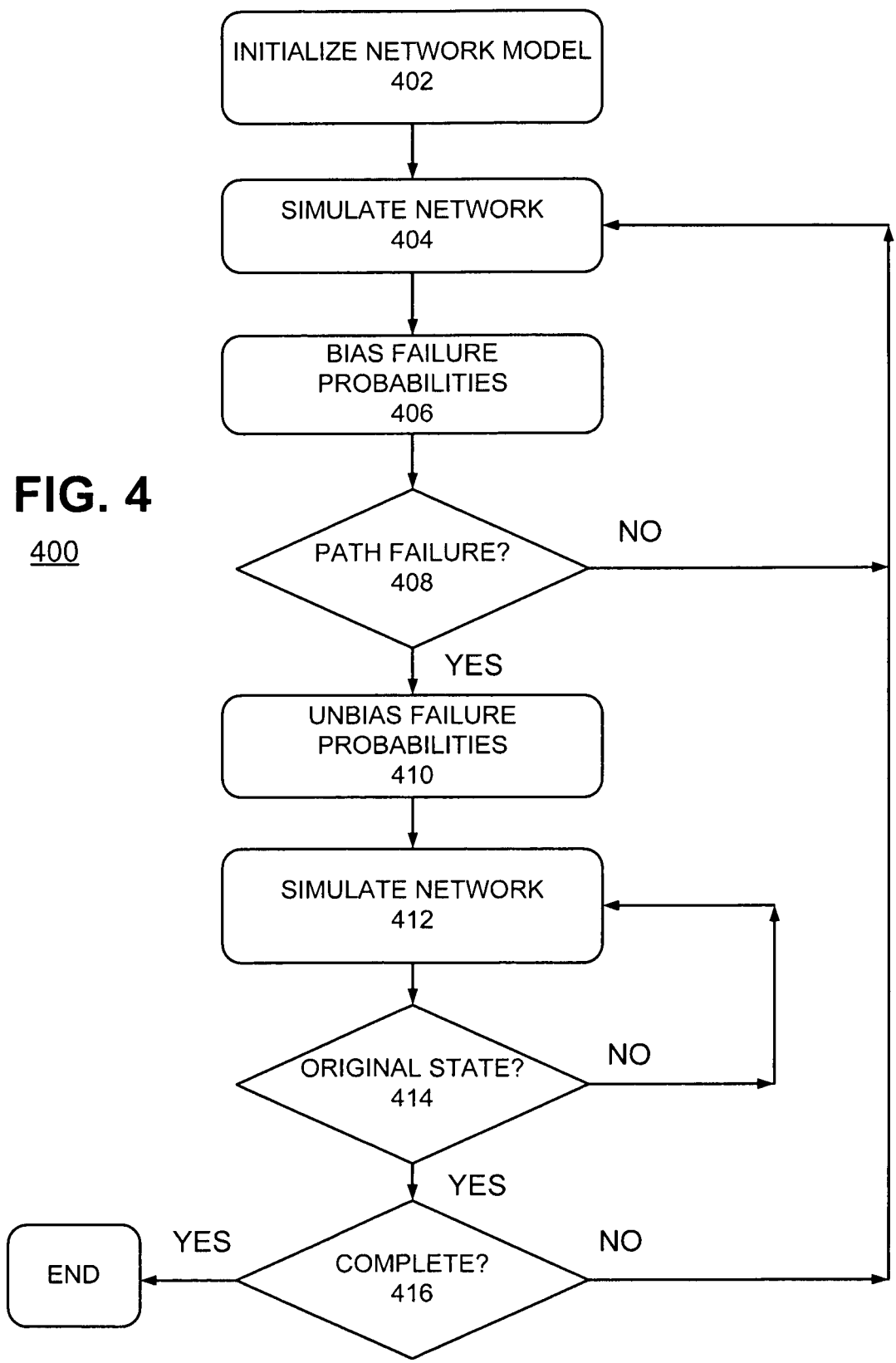

SIMULATION OF COMMUNICATION NETWORKS

BACKGROUND INFORMATION

Businesses and individuals increasingly rely on communication networks for critical functions. For example, businesses may rely on critical business applications (e.g., database applications, mail server applications, word processing applications, etc.) provided over a network, such as the public Internet or a leased private network. As these applications migrate to the "cloud" from the desktop and back-room server, the reliability of the network becomes increasingly more important. Businesses and individuals demand near perfect reliability and up-time from their networked applications and services.

BRIEF DESCRIPTION OF THE DRAWINGS

FIG. 4 is a flowchart of a process for simulating a network model for determining network reliability.

DETAILED DESCRIPTION OF PREFERRED EMBODIMENTS

The following detailed description refers to the accompanying drawings. The same reference numbers in different drawings may identify the same or similar elements. Also, the following detailed description does not limit the invention.

Methods and apparatuses disclosed herein may allow for the simulation of networks for determining the service reliability and/or availability of the network, including the simulation of highly-reliable networks.

Although embodiments described herein may allow for simulating any type of network model, the embodiments may be used for simulating highly-reliable networks, such as mesh networks. In a mesh network, communications between endpoints in the network may follow arbitrary communication paths between the endpoints. This arbitrariness may result in highly reliable networks because, when a portion of the network fails (e.g., a communication link), a communication path between endpoints may be rerouted so that communications between endpoints are not interrupted or affected by the failure.

The flexibility of a mesh network contrasts to other network architectures that provide dedicated or pre-established redundancy (e.g., protection links or redundant rings). The flexibility of a mesh network may provide (1) higher service reliability, (2) more efficient use of redundant network capacity, (3) lower costs, (4) more effective traffic engineering, and (5) simplified network operations and management. As a result, mesh networks are becoming increasing popular as an architecture for resilient, highly-reliable networks. For example, mesh networks may be used for photonic networks, ad hoc wireless networks, sensor networks, peer-to-peer networks, and application layer networks.

The analysis and simulation of highly reliable networks, such as a mesh network, may pose challenges precisely because of their high reliability. For example, the simulation of a highly-reliable network architecture may take an impracticable amount of time because the simulation may not result in any measurable failure. Embodiments disclosed herein may be used for simulating such highly-reliable network models. These same embodiments, however, may also be used for simulating other types of networks and may make the simulation of those networks more efficient. In one embodiment, dynamic importance sampling (DIS) may be used to bias transition rates (e.g., failure or repair rates) during simulation, such that the simulation is driven toward communication path failures, e.g., failures of paths that cannot be restored by rerouting the path through the network.

Figure 1A:
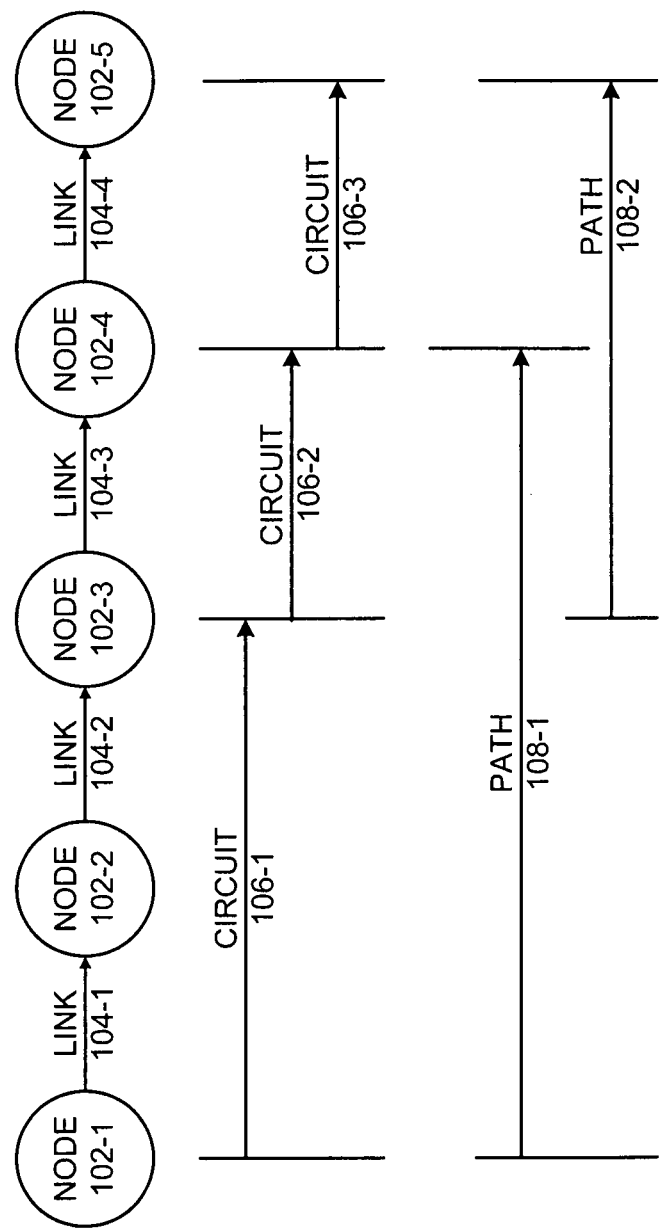
FIGS. 1A and 1B are block diagrams of exemplary network models in graphical form.

A network model may include nodes, links, circuits, and paths. For example, FIG. 1A is a block diagram of an exemplary network model 100 in graphical form. Network model 100 includes nodes 102-1 through 102-5 (collectively nodes 102, individually node 102-$y$), links 104-1 through 104-4 (collectively links 104, individually link 104-$x$), circuits 106-1 through 106-3 (collectively circuits 106, individually circuit 106-$m$), and paths 108-1 through 108-2 (collectively paths 108, individually path 108-$i$). Although network model 100 is described as a network "model," network model 100 may represent a real network and may be referred to simply as "network 100." In one embodiment, network model 100 represents a mesh network, but other types of networks are possible, such as a fiber-optic ring network.

Nodes 102 may include computers (e.g., servers, desktop computers, and/or laptop computers), televisions, telephones, personal digital assistants (PDAs), routers, switches, or any computational device that may receive data from one link 104-$x$ and may transmit the received data on another link 104-$x$.

As shown in FIG. 1A, links 104 may connect nodes 102 in network 100. For example, link 104-1 connects node 102-1 with node 102-2. In one embodiment, links 104 may be unidirectional, point-to-point links. In this embodiment, a bidirectional link (not shown) may be modeled, for example, using a pair of unidirectional links.

Links 104 may include physical media (e.g., wired or wireless links) that carry data from one node 102-$y$ to another node 102-$y$. Links 104 may include fiber optic cables, wireless radio channels, Ethernet cables, twisted pairs, coaxial cables, etc. Links may carry communications using protocols such as the Ethernet protocol, the Internet Protocol (IP), etc.

Circuits 106 may use links 104 to connect nodes 102 in network 100. For example, circuit 106-1 may employ links 104-1 and 104-2 to connect node 102-1 with node 102-3. Each circuit 106-$m$ may include unidirectional circuit-switched connections between two nodes using a set of interconnected links. Although not shown in network 100, a link may be used by more than one circuit. A bidirectional circuit (not shown) may be modeled as a pair of unidirectional circuits, which may follow different routes through the nodes of a network.

Paths 108 may use circuits 106 to connect nodes 102 in network 100. Further, paths 108 may be defined in terms of circuits 106. For example, path 108-1 may employ circuits 106-1 and 106-2 to connect nodes 102-1 and 102-4. As another example, path 108-2 may employ circuits 106-2 and 106-3 to connect nodes 102-3 and 102-5. Each path 108-$i$ may include a unidirectional virtual-circuit connection between two nodes (e.g., endpoints) over a set of interconnected circuits. A bidirectional path (not shown) may be modeled as a pair of unidirectional paths, which may follow different routes in each direction through nodes of a network. As shown in network 100, a circuit (e.g., circuit 106-2) may be used by more than one path (e.g., paths 108-1 and 108-2).

In one embodiment, the failure of a link results in the failure of the circuits that use the failed link. Likewise, the failure of a circuit may result in the failure of the paths that use the failed circuit if, for example, the path cannot be rerouted to use circuits that have not failed. In this embodiment, when a path employs a failed circuit, the network may use a "path restoration algorithm" in an attempt to reroute the path using "operational" circuits (e.g., non-failed circuits). When the failed circuit becomes operational again because, for example, the failed link has been repaired, the network may attempt to reroute the path again to employ the now operational circuit. If, when a circuit fails, no alternative operational circuit can be found to route the path from its source to its destination, the path also fails.

Figure 1B:
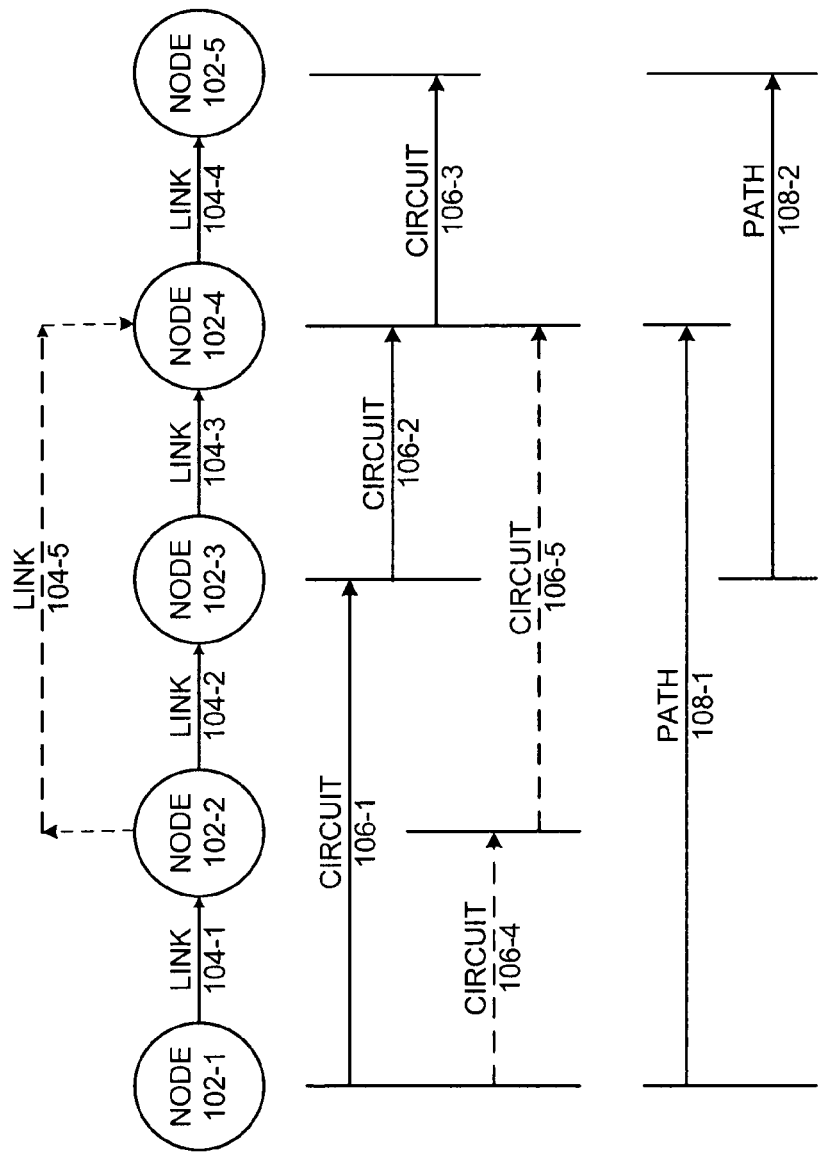
Figure 1C:
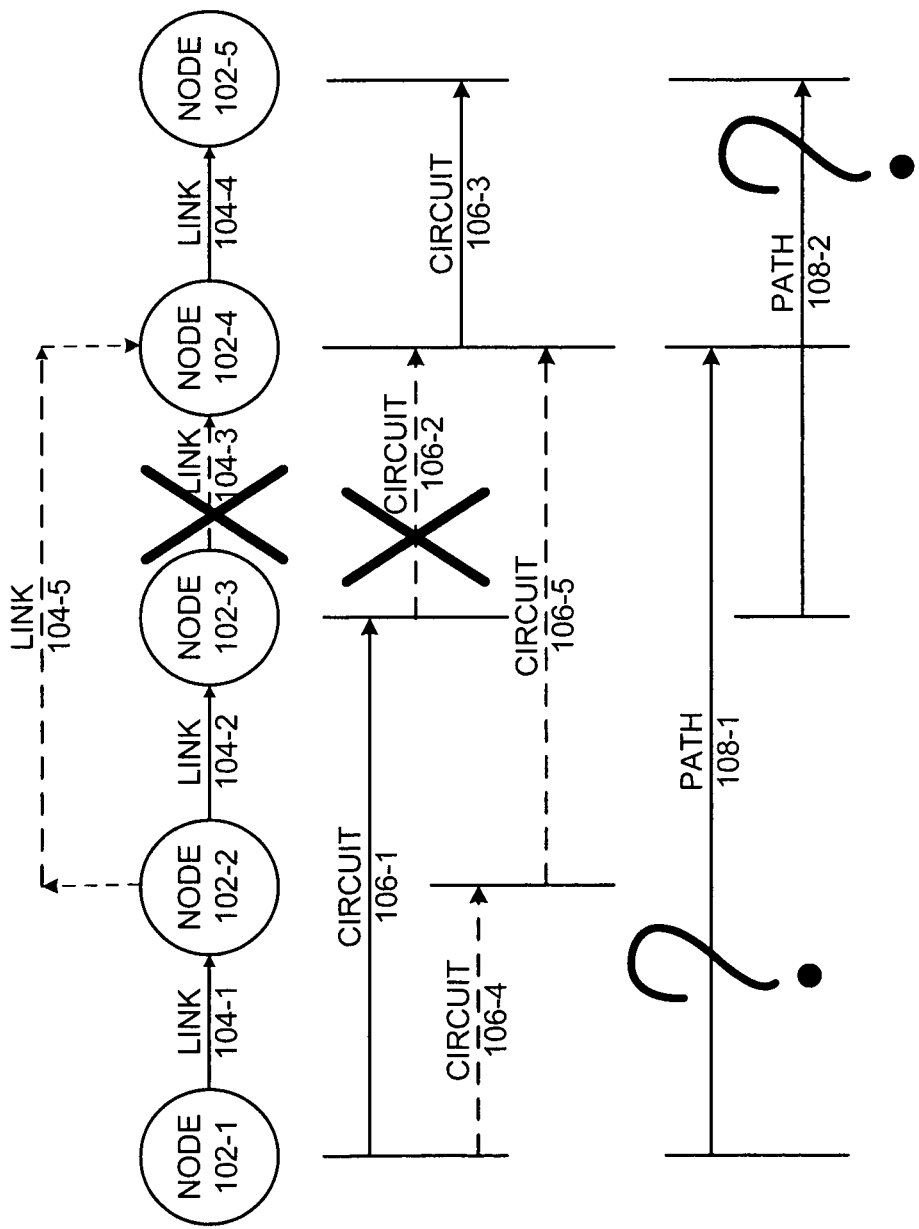
FIG. 1C is a block diagram of an exemplary network model in graphical form including failed links and circuits.
Figure 1D:
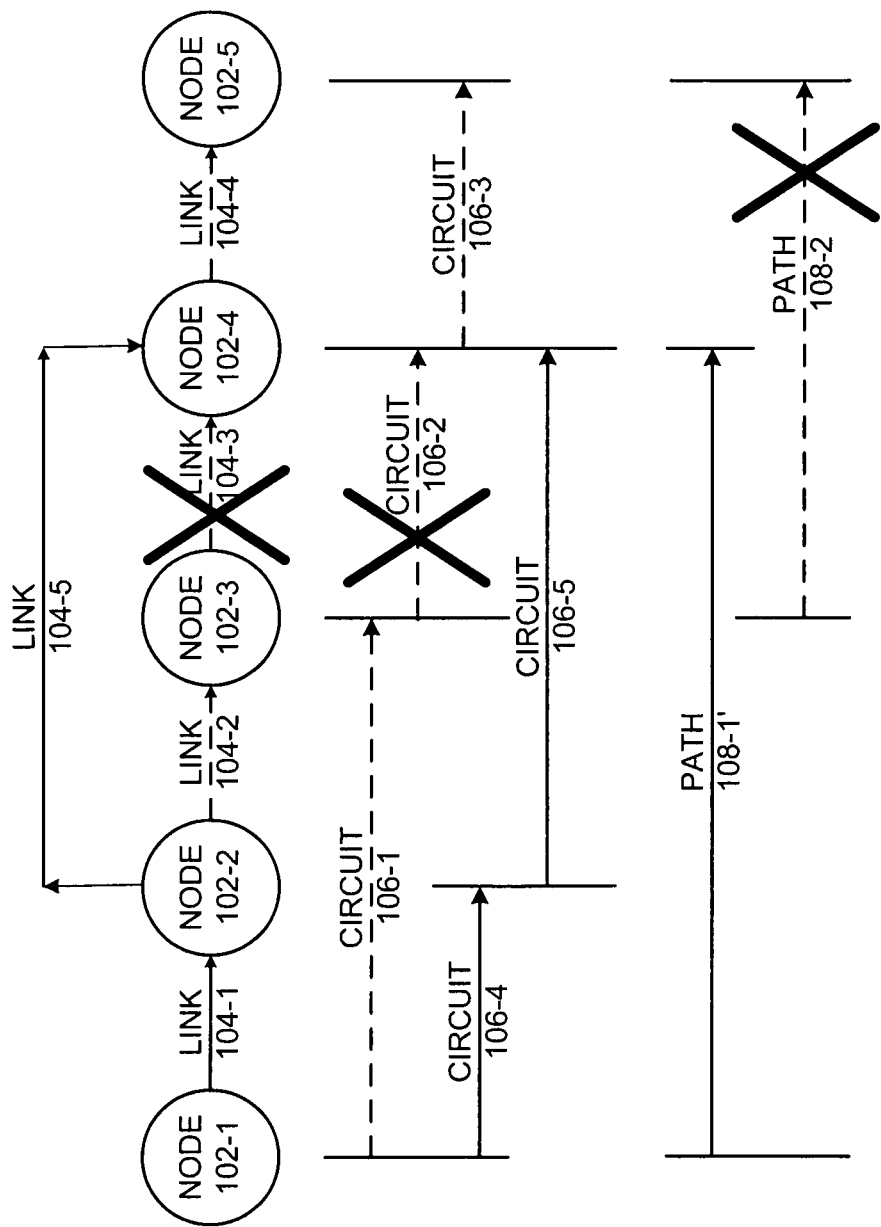
FIG. 1D is a block diagram of the exemplary network model of FIG. 1C including a rerouted path and a failed path.

FIGS. 1B, 1C, and 1D provide an example of path restoration. FIG. 1B is a block diagram of an exemplary network 100', which is the same as network 100 of FIG. 1A but for the addition of link 104-5 (between nodes 102-2 and 102-4), circuit 106-4 (using link 104-1), and circuit 106-5 (using link 104-5). In exemplary network 100', link 104-5 and circuits 106-4 and 106-5 are represented as dashed lines because they are not used by any operational paths or circuits (e.g., paths 108 or circuits 106). In this example, link 104-3 may be used by more than one circuit, e.g., circuits 106-2 and 106-5. Likewise, circuit 106-2 may be used by more than one path, e.g., paths 108-1 and 108-2.

FIG. 1C includes network 100' of FIG. 1B, but for the failed state of link 104-3 (indicated in the figure by an "X"). A link may fail, in the case of a fiber-optic cable for example, because an operator accidentally cuts the fiber of the link. In one embodiment, a failed link has no bandwidth to carry data. In another embodiment, a failed link has a reduced bandwidth to carry data. Unlike a failed link, an operational link has its full bandwidth available to carry data. As shown in FIG. 1C, links 104-1, 104-2, 104-4, and 104-5 are in an operational state, even though link 104-3 has failed. A failure of link 104-3 means that data cannot pass from node 102-3 to node 102-4 (or, in one embodiment, that the data flow is limited). The "failure" of link 104-3, therefore, could be caused by a number of reasons other than the actual inability of link 104-3 to deliver data. For example, the failure of link 104-3 may actually be the result of the failure of node 102-3, and not because of any intrinsic changes to link 104-3. In this example, the failure of node 102-3 may also result in the "failure" of link 104-2 (although not shown in FIG. 1C).

In this example, the failure of link 104-3 results in the failure of circuit 106-2 (indicated in the figure by an "X"), because circuit 106-2 uses link 104-3. Further, the failure of circuit 106-2 could potentially result in the failure of both paths 108-1 and 108-2 (indicated in the figure by a "?"), both of which use circuit 106-2, if the path restoration algorithm cannot find alternate operational circuits to reroute paths 108-1 and 108-2 from their respective source nodes to their respective destination nodes.

FIG. 1D includes network 100' of FIGS. 1B and 1C, but path 108-1 has been restored as path 108-1' and path 108-2 has failed (indicated in the figure by an "X"). The path restoration algorithm rerouted path 108-1 as path 108-1', where path 108-1' uses circuits 106-4 and 106-5 rather than circuits 106-1 and 106-2. Link 104-5 and circuits 106-4 and 106-5 are represented with solid lines in FIG. 1D (as opposed to FIG. 1C) because they are used by restored path 108-1', which is operational. Path 108-2, however, could not be restored by a path restoration algorithm because the algorithm could not find alternative circuits for carrying path 108-2 from node 102-3 to node 102-5. Links 104-3 and 104-4 and circuits 106-1, 106-2, and 106-3 are represented with dashed lines in FIG. 1D (as opposed to FIG. 1C) because they are not used by any operational paths and/or operational circuits.

Exemplary networks 100 and 100' may include more, fewer, or different devices (e.g., nodes, links, circuits, and/or paths) than shown. For example, network 100 may include hundreds or thousands of nodes, links, circuits, and paths. Further, although FIGS. 1A through 1D show nodes 102, links 104, circuits 106, and paths 108 in a particular configuration, they may also be arranged in other configurations.

Network 100 and network 100' may include the Internet, an ad hoc network, a local area network (LAN), a wide area network (WAN), a metropolitan area network (MAN), a cellular network, a PSTN, a high-speed fiber optic network (e.g., FiOS™), or any other network or combinations of networks. In the case of a cellular network, nodes may employ a wireless communication protocol, e.g., GSM (Global System for Mobile Communications), CDMA (Code-Division Multiple Access), WCDMA (Wideband CDMA), GPRS (General Packet Radio Service), EDGE (Enhanced Data Rates for GSM Evolution), etc. Nodes 102 may communicate with other nodes 102 using wireless or wired network standards such as WiFi (e.g., IEEE 802.11x), WiMAX (e.g., IEEE 802.16x), or Ethernet.

Network model 100 and network 100' may be simulated in a workstation (e.g., a laptop, desktop, or any other type of computing device) to determine, for example, the reliability of network 100. The workstation may include one or more computing modules for hosting programs, databases, and/or applications, such as a network simulation application. As mentioned above, nodes 102 may also include computers, which may include one or more computing modules for hosting programs, databases, and/or applications, such as a routing application.

Figure 2:
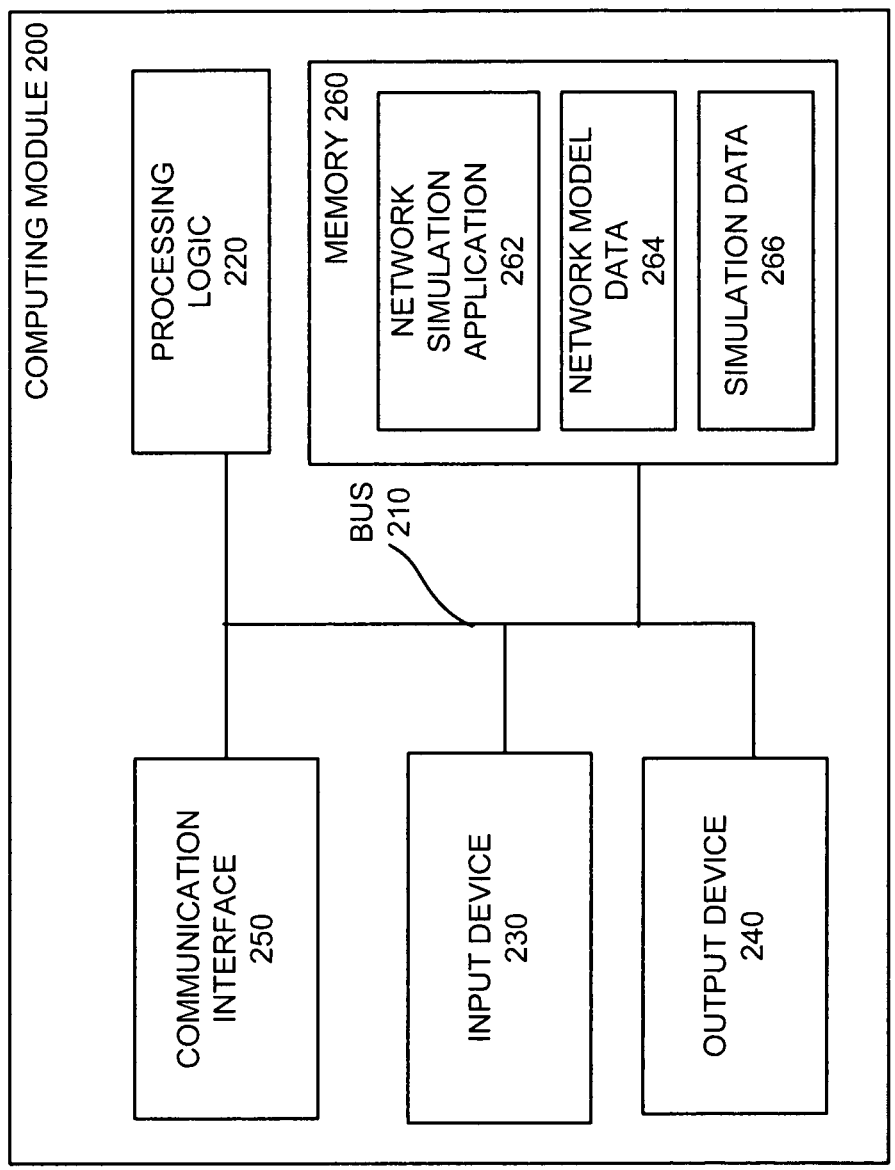
FIG. 2 is a block diagram of exemplary components of a computing module.

FIG. 2 is a block diagram of exemplary components of a computing module 200. Computing module 200 may include a bus 210, processing logic 220, an input device 230, an output device 240, a communication interface 250, and a memory 260. Computing module 200 may include other components (not shown) that aid in receiving, transmitting, and/or processing data. Moreover, other configurations of components in computing module 200 are possible.

Bus 210 may include a path that permits communication among the components of computing module 200. Processing logic 220 may include any type of processor or microprocessor (or groups of processors or microprocessors) that interprets and executes instructions. In other embodiments, processing logic 220 may include an application-specific integrated circuit (ASIC), a field-programmable gate array (FPGA), or the like.

Input device 230 may include a device that permits a user to input information into computing module 200, such as a keyboard, a mouse, a pen, a microphone, a remote control, a touch-screen display, etc. Output device 240 may include a device that outputs information to the user, such as a display, a printer, a speaker, etc.

Input device 230 and output device 240 may allow the user to activate a particular service or application, such as a simulation application. Input device 230 and output device 240 may allow the user to receive and view a menu of options and select from the menu options. The menu may allow the user to select various functions or services associated with applications executed by computing module 200.

Communication interface 250 may include any transceiver-like mechanism that enables computing module 200 to communicate with other devices and/or systems. Communication interface 250 may include a transmitter that may convert baseband signals to radio frequency (RF) signals and/or a receiver that may convert RF signals to baseband signals. Alternatively, communication interface 250 may include a transceiver to perform functions of both a transmitter and a receiver. Communication interface 250 may be coupled to an antenna for transmission and reception of the RF signals.

Communications interface 250 may include a network interface card, e.g., Ethernet card, for wired communications or a wireless network interface (e.g., a WiFi) card for wireless communications. Communication interface 250 may also include, for example, a universal serial bus (USB) port for communications over a cable, a Bluetooth™ wireless interface for communicating with Bluetooth-enabled devices, a near-field communication (NFC) interface, etc. Communication interface 250 may implement a wireless communication protocol, e.g., GSM, CDMA, WCDMA, GPRS, EDGE, etc. Communications interface 250 may also receive, transmit and/or process digital or analog audio inputs/outputs and/or digital or analog video inputs/outputs.

Memory 260 may include a random access memory (RAM) or another type of dynamic storage device that may store information and instructions, e.g., an application and application data, for execution by processing logic 220; a read-only memory (ROM) device or another type of static storage device that may store static information and instructions for use by processing logic 220; and/or some other type of magnetic or optical recording medium and its corresponding drive, e.g., a hard disk drive (HDD), for storing information and/or instructions.

If computing module 200 is configured to simulate a model of a network, as shown in FIG. 2, memory 260 may include a network simulation application 262, network model data 264, and simulation data 266. Network model data 264 may include text and/or graphical descriptions of a network (e.g., text or graphical descriptions of network model 100 shown in FIG. 1A).

Simulation application 262 may include a text-based simulation environment (e.g., employing Visual Basic, ns-2, ns-3, MATLAB; Octave; Python; Comsol Script; MATRIXx from National Instruments; Mathematica from Wolfram Research, Inc.; Mathcad from Mathsoft Engineering & Education Inc.; Maple from Maplesoft; etc.), a graphically-based simulation environment (e.g., Simulink, Stateflow, SimEvents, etc., by The MathWorks, Inc.; VisSim by Visual Solutions; LabView by National Instruments; etc.), or another type of simulation environment, such as a hybrid environment that includes one or more of the above-referenced text-based environments and one or more of the above-referenced graphically-based environments.

If network 100 were a real, physical network, for example, then each of nodes 102 may include one or more computing modules 200. In this case, memory 260 may include an application for receiving packets and routing packets. For example, the application may be configured to receive a packet on a first link 102-x for forwarding on second link 102-x toward its destination. In this example, the application may also include a link-status application to detect whether a link, circuit, and/or path has failed, is operational, or has been restored. In this case, memory 260 may also include a path restoration algorithm for restoring broken paths. Alternatively, network simulation application 262, network model data 264, and simulation data 266 may allow computing module 200 to simulate each of nodes 102 in network model 100, for example.

Computing module 200 may perform certain operations, as described herein. Computing module 200 may perform these operations in response to processing logic 220 executing software instructions contained in a computer-readable medium, such as memory 260. A computer-readable medium may be defined as a physical or logical memory device. The software instructions may be read into memory 260 from another computer-readable medium or from another device via communication interface 250. The software instructions contained in memory 260 may cause processing logic 220 to perform processes that are described herein.

Figure 3:
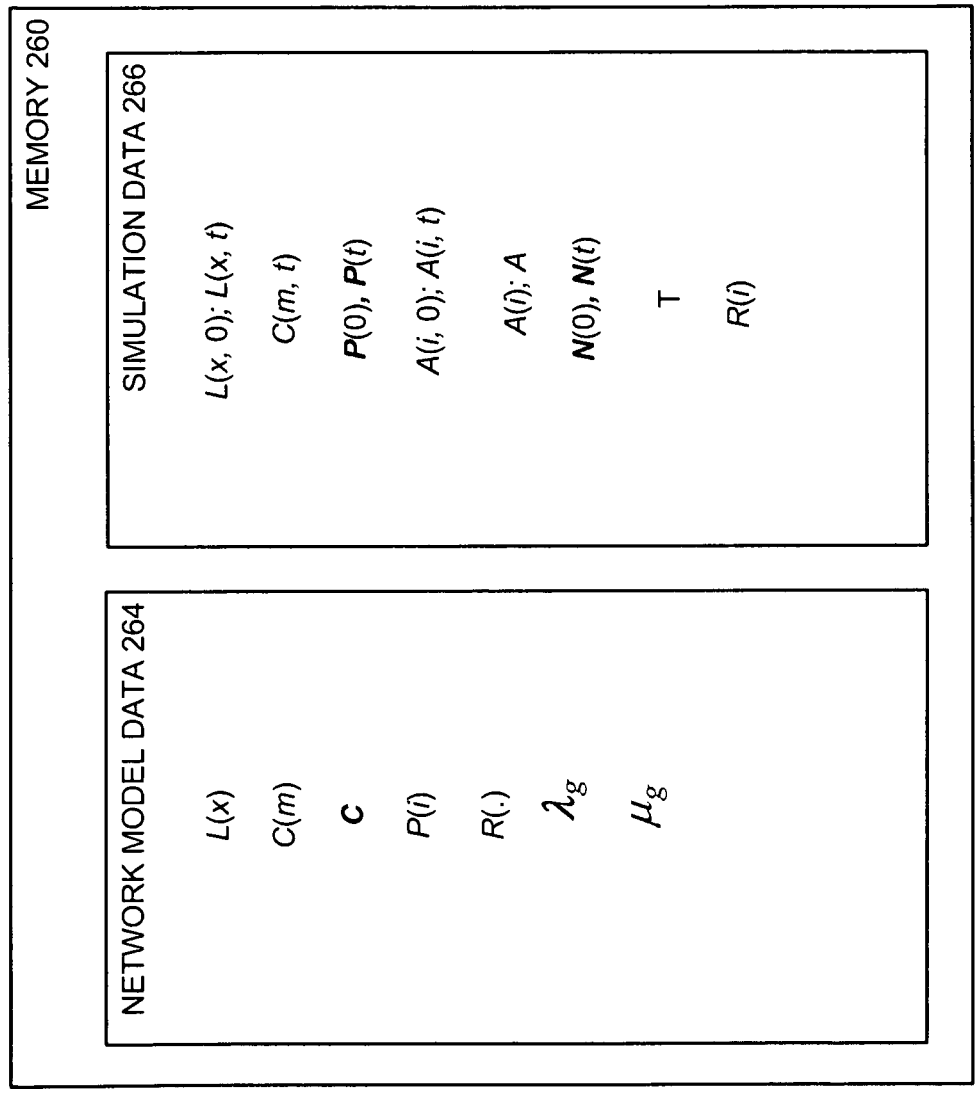
FIG. 3 is a block diagram of the memory of the computing module of FIG. 2, including exemplary network model data and simulation data.

FIG. 3 is a block diagram of memory 260 including exemplary network model data 264 and simulation data 266. Network model data 264 and simulation data 266 may describe a network model using various parameters, such as bandwidth, latency, jitter, link end points, circuit end points (and the links employed), and path end points (and the circuits employed), among other things. Network model data 264 and simulation data 266 may include many arrays, matrices, vectors, constants, and/or tables of data specifying the network model in an initial state and in states at different times.

In the embodiment of FIG. 3, network model data 264 may store time-independent data describing the network model for simulation. Simulation data 266 may store time-dependent data for the network model being simulated and data calculated during the simulation of a network model by network simulation application 262 (shown in FIG. 2). In another embodiment, data stored in network model data 264, however, may also be stored in simulation data 266, and vice versa.

As shown in FIG. 3, network model data 264 may include a maximum link bandwidth array $L(x)$, a maximum circuit bandwidth array $C(m)$, a circuit matrix C, a required path bandwidth array $P(i)$, a path restoration algorithm $R(.)$, a failure rate $\lambda_g$, and a repair rate $\mu_g$. Simulation data 266 may include an available link bandwidth array $L(x, t)$ including its initial state $L(x, 0)$, an available bandwidth array $C(m, t)$, a path routing matrix $P(t)$ including its initial state $P(0)$, a path availability array $A(i, t)$ including its initial state $A(i, 0)$, a path availability array $A(i)$, an average path availability A, a group state $N(t)$ and its initial group state $N(0)$, a recurrence time T, and an average operational time $R(i)$. While these data are described below, other data may also be stored in network model data 264 and/or simulation data 266. For example, network model data 264 and/or simulation data 266 may include the corresponding Markov model state information that corresponds to the time-dependent information.

Maximum link bandwidth array $L(x)$ may specify the maximum bandwidth in bits/second for each link x, where x ranges between 1 and the total number of links L. Available link bandwidth array $L(x, t)$ may specify the available bandwidth of link x at time t. For example, a bandwidth of $L(1, 5)=0$ may indicate that link 1 failed at time $t=5$ or earlier.

Maximum circuit bandwidth array $C(m)$ may specify the maximum bandwidth in bits/second for each circuit m, where m ranges between 1 and the total number of circuits C. In other words, circuit m may consume a bandwidth of $C(m)$ in each of the links that circuit m uses. The bandwidth of circuit m may vary with time. Available bandwidth array $C(m, t)$ may specify the available bandwidth of circuit m at time t. For example, a bandwidth of $C(1, 5)=0$ may indicate that circuit 1 failed at time $t=5$ or earlier. In one embodiment, if a circuit fails, its bandwidth may decrease to zero. In another embodiment, if a circuit fails, the bandwidth may decrease, but to a positive value other than zero.

Circuit matrix C may define the links that each circuit uses. Matrix C may be expressed as $C=[c_{mx}]$, where m is the circuit number and x is the link number. In one embodiment, $c_{mx}=1$ indicates that circuit m uses link x, whereas $c_{mx}=0$ indicates that circuit m does not use link x. Circuit matrix C may be static with time and may be expressed as $$C=[c_{mx}:1\leq m\leq C \text{ and } 1\leq x\leq L]$$

where C is the total number of circuits and L is the total number of links.

A required path bandwidth array P(i) may specify the required bandwidth in bits/second of path i. In other words, path i may use the bandwidth of P(i) in each circuit m that path i uses, where i may range from 1 to P, the total number of paths.

Path routing matrix $P(t)=[p_{im}(t)]$ may specify the route taken by path i at time t through circuits m. In one embodiment, $p_{im}(t)=1$ indicates that path i uses circuit m at time t, whereas $p_{im}(t)=0$ indicates that path i does not use circuit m at time t. Path routing matrix P(t) may vary with time as paths are rerouted as circuits fail and are repaired during simulation. Path routing matrix P(t) may be given by $$P(t)=[p_{im}(t):1\leq i\leq P, 1\leq m\leq C],$$

where P is the total number of paths and C is the total number of circuits.

A path restoration algorithm R(.) may reroute a path using operational circuits when a circuit that the path employs fails. If, when a circuit fails, no alternative operational circuit can be found to route the path from its source to its destination, the path restoration algorithm may determine that the path has failed. Path restoration algorithm R(.) may also determine the initial routes (e.g., the initial circuits used by) of a path when a simulation starts or when a network is established.

Path restoration algorithm R(.) may include any of a number of algorithms. For example, path restoration algorithm R(.) may include a static algorithm that specifies a fixed number of pre-determined alternate paths. In another embodiment, path restoration algorithm R(.) may include a dynamic algorithm that determines a restored path based on a number of rules. In this embodiment, the number of alternate paths may be very large and may increase exponentially or geometrically with the number of nodes, links, and circuits. Path restoration algorithm R(.) may find the next shortest route (e.g., least cost path, minimum hop path), subject to the bandwidth constraints of the circuits, as compared to alternate paths. Path restoration algorithm R(.) may find a route that maximizes the remaining capacity of the circuits in the restored path as compared to alternate paths. Path restoration algorithm R(.) may find a route based on a load balancing algorithm. Path restoration algorithm R(.) may reroute (or repack) operational paths to optimize other criteria. Path restoration algorithm Ro may find a route based on any other type of algorithm that provides routes for paths in a network.

Path restoration algorithm R(.) may also reroute paths when links and/or circuits are repaired. In this embodiment, when a failed link is repaired, circuits that use the link may become operational. The newly operational circuits may then be available for failed paths to use. Path restoration algorithm R(.) may also reroute operational paths to take advantage of the new operational circuits based on, for example, some of the same criteria used for rerouting paths discussed above.

As discussed above, path restoration algorithm R(.) may find new routes for paths subject to the bandwidth constraints of circuits and links. For example, in one embodiment, the bandwidth of circuit m is constrained to be less than or equal to the bandwidth L(x) of any link x that carries circuit m. This constraint may be expressed as $$C(m)\leq \text{Min}\{L(x)|c_{mx}=1, \text{ where } 1\leq x\leq L\}.$$

As another example, a link x may be used by more than one circuit. Thus, in one embodiment, the sum of the bandwidths C(m) of each circuit m that uses link x is constrained to be less than or equal to the bandwidth L(x) of link x. This constraint may be expressed as $$\Sigma_{m=1}^{C} C(i) c_{mx}\leq L(x), \text{ for } 1\leq x\leq L.$$

In this embodiment, the bandwidth of circuit m at time t may be constrained to be less than or equal to the bandwidth L(x, t) of any link x at time t that carries circuit m. This constraint may be given by $$C(m,t)\leq \text{Min}\{L(x,t)|c_{mx}=1, 1\leq x\leq L\}.$$

In one embodiment, the routing of paths may also be constrained, for example, such that the available bandwidth of each circuit is not exceeded. In this embodiment, the constraint may be given by $$\Sigma_{i=1}^{P} P(i) p_{im}(t)\leq C(m,t), \text{ for } 1\leq m\leq C.$$

The available bandwidth of the circuits at time t may be defined by the vector $C(t)=(C(1, t), \ldots, C(C, t))$. As discussed above, the path routing matrix at time t may be given by P(t). If at time $t^+$ a link failure or repair event causes a new condition or state of the circuits to become $C(t^+)$, path restoration algorithm R(.) may determine whether a path has failed (in the case of a link failure event) or whether a path has been restored (in the case of a link restoration event). In either case, the path restoration algorithm R(.) may determine a new routing matrix $P(t^+)$ based on P(t), subject to the circuit bandwidth vector $C(t^+)$. Routing matrix $P(t^+)$ may be given by $$P(t^+)=R(P(t),C(t^+)).$$

If a particular path i is affected by a failure event and the path cannot be rerouted, then the routing matrix entries for path i may, in one embodiment, be left at arbitrary values and $A(i, t^+)$ may be set to zero to indicate that path i has failed.

Specific routes taken by the rerouted paths can depend upon the sequence in which link failure and repair events occur. Hence, the routing and rerouting of paths may depend on the order of realized events (e.g., during simulation). When all links return to an operational state, the resulting path routing matrix P(t) may be different from initial path routing matrix P(0). In one embodiment, for simplification, it may be assumed that path restoration algorithm R(.) returns all paths to their initial routes specified in initial path routing matrix P(0) once all links become operational. This assumption may be expressed as $$R(P(t),C(t^+))=P(0) \text{ if } C(t^+)=(C(1), \ldots, C(C)).$$

In practice, this assumption for a simulation of a network may account for reality because the initial routes (e.g., as specified in path routing matrix P(0)) are the desired routes under normal operating conditions.

Path restoration algorithm R(.) may store the availability of a path i in path availability array A(i, t). Path availability array A(i, t) may indicate whether path i is available (e.g., in an operational state or a failed state) at a time t. In one embodiment, if A(i, t)=1, then path i is in an operational state at time t, whereas if A(i, t)=0, then path i is in a failed state at time t.

Failure rate $\lambda_g$ and repair rate $\mu_g$ describe the rates of failure and repair, respectively, associated with links or groups of links in a network model. Failure rate $\lambda_g$ and repair rate $\mu_g$ may represent the hoped-for, measured, or observed failure and repair rates of a real-world network or a network model. Failure rate $\lambda_g$ and repair rate $\mu_g$ are examples of "transition rates." A transition rate means the rate of which a model element (e.g., a link, a node, etc.) and/or a model state (e.g., a Markov model state) transitions to a different state, condition, etc. For example, failure rate $\lambda_g$ may indicate the rate at which a link transitions from an operational state to a failed state. As another example, repair rate $\mu_g$ may indicate the rate at which a link transitions from a failed state to an operational state. Other transition rates are possible, such as the rate at which a link experiences radio interference, the rate at which a link experiences a reduced (but non-zero) bandwidth, the rate at which a link experiences a partial failure (e.g., at certain wavelengths, frequencies, etc.), or the rate of reduced signal integrity due to fiber nonlinearity effects. Embodiments described herein use failure rate $\lambda_g$ and repair rate $\mu_g$, but any type of transition rates, probabilities, etc., are possible.

In one embodiment, link failures may be considered independent events from each other and link repairs may also be considered independent events from each other. This embodiment may be overly simplistic, however, because in reality link failures are often not independent of each other. For example, connections between nodes often include two bidirectional links that may fail simultaneously (e.g., a fiber cut) and may be repaired simultaneously (e.g., in one service call). Also, multiple link failures may be correlated (e.g. not independent) because a node, which connects to the multiple links, fails. In this situation, all the links connected to the failed node may enter a failed state simultaneously. The failure of a node or the failure of multiple links simultaneously may also be caused by natural or man-made events in a geographic area associated with the multiple links. Also, link failures may be correlated because the links share the same physical path, e.g., the same conduit from one end of the street to the other end.

To model such situations, links may be arranged into "equivalence groups." An equivalence group, which may be referred to more simply as "a group," may include a set of links, and a link may belong to one or more equivalence groups. In one embodiment, each group may be in an operational state or a failed state. In this embodiment, (1) when a group is in a failed state, then all the links in the group are considered unusable, e.g., the links are also in a failed state; (2) if a link belongs to more than one group and at least one of those groups is in a failed state, then the link is unusable; and (3) a link is considered useable, e.g., in an operational state, if all the groups to which the link belongs are in an operational state.

In other embodiments, the failure of a link may be correlated to the failure of another link (e.g., a link in a group of links) in many different ways. For example, the correlation of failures in a first link and a second link may be greater than 0 but less than one. In this example, the failure of the first link may raise the probability of failure in the second link (or shorten the mean time to failure or increase the failure rate) without necessarily dictating that the second link must fail.

Failure rate $\lambda_g$ may specify the rate of failure of group g, where g ranges from 1 to G, the total number of failure equivalence groups. Repair rate $\mu_g$ may specify the rate of repair of a group g, again, where g ranges from 1 to G. In one embodiment, the failure time of each group g may be an exponentially distributed random variable, independent of the failure times of other groups. The repair time of each group g may also be an exponentially distributed random variable independent of the repair time of other groups. In another embodiment, the rate of failure of one group may not be entirely independent of the rate of failure of another group (e.g., their correlation may be greater than zero) or the rate of repair of one group may not be independent of the rate of repair of another group.

Group state $N(t)=(N_1(t), \ldots, N_G(t))$ may be a random variable that specifies the state of the groups at time t. In one embodiment, a group state element $N_g(t)=0$ indicates group g is operational at time t, whereas a group state element $N_g(t)=1$ indicates group g is in a failed state at time t.

Group state N(t) may be determined by a group process that decides which groups of links are in a failed state or not. The group process may form a continuous-time Markov chain with state-space $S=\{n|n=(n_1, \ldots, n_G), n_g=0 \text{ or } 1, 1 \leq g \leq G\}$ and an initial state $N(0)=(0, \ldots, 0)$. In one embodiment, $n_g=0$ indicates that group g is in an operational state and $n_g=1$ indicates that group g is in a failed state. Hence, the group process may drive the available bandwidth of the circuits (e.g., as expressed in available bandwidth array C(i, t)) and, consequently, the rerouting of paths (e.g., as expressed in path routing matrix P(t)).

In one embodiment, it can be assumed that local balance holds between all pairs of states in the Markov chain of the group process, and the steady-state distribution for the group process may be derived. In this Markov chain, a unit vector $1_g$ may point in the direction g, where $1 \leq g \leq G$. In this case, the transition rate from state n to state $n+1_g$ is equal to $\lambda_g$ if $n_g=0$, and 0 otherwise. Further, the transition rate from state $n+1_g$ to state n, is equal to $\mu_g$ if $n_g=0$, and 0 otherwise. A rate ratio $\rho_g$ may be expressed as $\rho_g=\lambda_g/\mu_g$. In this case, the steady-state probability $\pi(.)$ of the group process being in state n (the state distribution $\pi(n)$) may be given by $$\pi(n)=\Pi_{g=1}^{G} \rho_g^{n_g}/(1+\rho_g).$$

Path availability array A(i) and average path availability A may represent network service reliability measures, e.g., the measure of the reliability of path i. In one embodiment, path availability array A(i) may indicate the average proportion of time that path i is operational. An average path availability A indicates the average service availability (or reliability) of a set of paths and may be given by $$A=\Sigma_{i=1}^{P} A(i)/P.$$

Path availability array A(i) and average path availability A may be useful values derived by simulating a network model.

Average operational time R(i) may represent the average time that path i is operational during a recurrence time T. Recurrence time T is a random variable of the time to travel from operational group state n=0 to a failed group state and back again to operational group state n=0. That is, group state n=0 is a regenerative state because, in one embodiment, the path restoration algorithm returns all paths to their initial routes P(0) when all links are repaired. Average operational time R(i) may be expressed as $$R(i)=E[\int_0^T A(i,t)dt],$$

where E[.] denotes expected value. Path availability array A(i) may be expressed as A(i)=R(i)/E[T]. An explicit analytical expression for the expected value of recurrence time T, e.g., E[T], may be obtained because the state distribution $\pi(n)$ is known, as shown above. Thus, in this embodiment, E[T] may not have to be estimated and the mean time S in state n=0 (referred to as the "sojourn" time in state n=0) may be expressed as $$S=1/\Sigma_{g=1}^{G} \lambda_g.$$

The steady-state probability $\pi(0)$ of the group process being in state n=0 may be expressed as $\pi(0)=S/E[T]$, e.g., the sojourn time S in state n=0 divided by the expected value of recurrence time T. Hence, the expected value of recurrence time T may be expressed as $$E[T]=S/\pi(0)=\Pi_{g=1}^{G}(1+\rho_g)/\Sigma_{g=1}^{G} \lambda_g.$$

and the path availability array A(i) may be given by $$A(i)=R(i)\Sigma_{g=1}^{G}\lambda_g/\Pi_{g=1}^{G}(1+\rho_g).$$

FIG. 4 is a flowchart of a process 400 for simulating a network model for determining network reliability, such as the average operational time R(i) that path i is operational during a recurrence time T, where $1 \leq i \leq P$.

Process 400 may begin with the initialization of a network model (block 402). To start, a network model for simulation may be described by maximum link bandwidth array L(x), maximum circuit bandwidth array C(m), circuit matrix C, required path bandwidth array P(i), and path restoration algorithm R(.). Initial paths P(0) may be provided by routing algorithm R(.). Further, in one embodiment, all paths may be initially operational, e.g., A(i, 0)=1 for $1 \leq i \leq P$, where P is the total number of paths.

The network may be simulated (block 404) or, in other words, the network model may be run or executed (block 404). In one embodiment, the continuous-time Markov chain (CTMC) of the group process may be run in a simulation. In another embodiment, the associated, embedded discrete-time Markov chain (DTMC) may be run in a simulation with deterministic state holding times. Simulating using the DTMC, rather than the CTMC, may reduce the variance of the simulated average operational times R(i) and may allow for a confidence interval requirement to be reached more rapidly.

In the DTMC embodiment, the discrete variables corresponding to continuous variables may be used, as discussed below. For example, the holding times of the states in the DTMC may be set to the corresponding mean holding times in the CTMC. The DTMC may be used to represent the group process with state space S. Using DTMC, the probability of transitioning from state n to state $n+1_g$ may be represented as transition probability $p(n, n+1_g)$, where $n_g=0$, $1 \leq g \leq G$, and $n \in S$. This transition probability $p(n, n+1_g)$ corresponds to the failure of group g and may be given by $$p(n,n+1_g)=\lambda_g/\Sigma_{i=1}^{G}\lambda_i^{1-n_i}\mu_i^{n_i}.$$

The probability of transitioning from state n to state $n-1_g$ may be represented as transition probability $p(n, n-1_g)$, where $n_g=1$, $1 \leq g \leq G$, and $n \in S$. This transition probability $p(n, n-1_g)$ corresponds to the repair of group g and may be given by $$p(n,n-1_g)=\mu_g/\Sigma_{i=1}^{G}\lambda_i^{1-n_i}\mu_i^{n_i}.$$

The deterministic holding time h(n) in state n may be given by $$h(n)=1/\Sigma_{i=1}^{G}\lambda_i^{1-n_i}\mu_i^{n_i}.$$

Discrete recurrence time Z may represent a discrete random variable of the recurrence time for state n=0 in the DTMC, e.g., the number of DTMC transitions in a tour from state n=0 back to the state n=0. DTMC state x(k) may represent the DTMC state at time k, where $0 \leq k \leq Z$, x(0)=0, and x(Z)=0. Circuit state matrix C(k) may represent the state of the circuits at time k and path state matrix P(k) be the state of the paths at time k. In one embodiment, the state of the circuits and paths do not change during the holding time in state x(k). When there is a state transition out of state x(k) due to a group failure or repair transition, the state of the circuits becomes C(k+1) and the paths become P(k+1), where P(k+1)=R(P(k), C(k+1)). Using DTMC, A(i, k) may represent the availability of path i at time k under C(k) and P(k).

The relation between R(i) in the CTMC to that in the DTMC may be given by $$R(i)=E[\int_0^T A(i,t)dt]=E[\Sigma_{k=0}^{Z}A(i,k)h(x)(k))].$$

Variable T(x) may represent the set of all possible tours t of length x starting at state n=0 and returning back to state n=0 in x steps, where $t=(0, t_2, \ldots, t_x, 0)$, and $t_k$ is the state visited at time k. Probability p(t) may represent the probability of realizing tour t. In this embodiment, the average operational time may be given by $$R(i)\sum_{x=2}^{\infty}\sum_{t\in T(x)}\sum_{k=1}^{x}A(i,k)h(t_k)p(t),$$

where $p(t)=p(0,t_2)p(t_2,t_3) \ldots p(t_x,0)$. A Markov Monte Carlo simulation of the DTMC model starting at state n=0 until the state returns to n=0 may result in an estimate of R(i) given by $$\Sigma_{k=1}^{x}A(i,k)h(t_k),$$

where x represents the realized number of steps, e.g., transition changes, in the particular replication or iteration. Thus, process 400 may start in group state n=0, travel to one or more failed group states, and then return to group state n=0 after all links and circuits are repaired. In other words, group state n=0 is a regenerative state.

Failure probabilities and/or failure rates may be biased (block 406). For example, the probability of transitioning from one state to another may be biased (e.g., increased or decreased). A Markov Monte Carlo simulation of the DTMC to estimate R(i) may be time consuming and impractical because, for example, the failure rates of the groups may be much smaller than the repair rates. In one embodiment, an importance sampling method may be used to estimate path availabilities in a network with path restoration, such as a mesh network with dynamic path restoration. Implementing dynamic importance sampling (DIS) in a simulation of a mesh network with dynamic-path restoration may be referred to as dynamic path-failure sampling (DPFS). DPFS may bias the state trajectory of the simulation toward path failures, e.g., failures of paths that cannot be restored by the path restoration algorithm. In DPFS, the failure rate of each failure equivalence group may be set at an increased level until path failures are observed (e.g., simulated) to occur given the dynamic path restoration algorithm.

Thus, to reduce the computational time for simulation, e.g., the number of independent replications or iterations before the confidence interval requirement has been reached, one embodiment may use importance sampling. In this embodiment, the state transition probabilities $p(t_a,t_b)$, $t_a,t_b \in S$, of the original DTMC may be modified to adjusted transition probabilities $p^*(t_a,t_b)$ so that group failures may be more likely to occur. In this embodiment, the average operational time may be given by $$R(i) = \sum_{x=2}^{\infty}\sum_{t\in T(x)}\sum_{k=1}^{x}A(i,k)h(t_k)\Lambda(t)p^*(t),$$

where $$p^*(t) = p^*(0, t_2)p^*(t_2, t_3) \ldots p^*(t_x, 0) \text{ and}$$

$$\Lambda(t) = p(t)/p^*(t) = \frac{p(0, t_2)p(t_2, t_3) \ldots p(t_x, 0)}{p^*(0, t_2)p^*(t_2, t_3) \ldots p^*(t_x, 0)}.$$

A simulation of the DTMC, starting at state n=0 and continuing until the state returns to state n=0, may result in an estimate of the average operational time R(i) given by $$\Sigma_{k=1}^{x}A(k,i)h(t_k)\Lambda(t),$$

where x may represent the realized number of transition steps in the modified DTMC. The ratio $\Lambda(t)$ may be termed the likelihood ratio.

The original transition probabilities p(.) may be changed (or biased) to the modified transition probabilities p*(.) in numerous ways. For example, the original transition probabilities p(.) may be modified initially at state n=0 and kept at that modified level until, for example, transitioning to a different state from n=0. The original transition probabilities p(.) may be modified using a static method or may be modified "on the fly," e.g., dynamically as a function of state or time. This dynamic method may be referred to as dynamic importance sampling.

With DPFS, a group failure bias β may be a constant, where β>1, such that the failure rate $\lambda_g$ of each group g is increased to the value $\beta\lambda_g$. Bias β may be, for example, 100, 1000, or 10000. The target failure rate ratio α, where α>0, may be defined as the desired ratio of the sum of the biased group failure rates to the sum of the group repair rates. Bias β may be defined in terms of target failure ratio α as $$\beta = \alpha \Sigma_{g=1}^{G} \mu_g / \Sigma_{g=1}^{G} \lambda_g.$$

In one embodiment, the value of target failure ratio α may be set by the user. A reasonable value for target failure ratio α may be determined with trial simulation runs.

If a path failure is not observed during a simulation (block 408: NO), the simulation may continue (block 404) until a path failure is observed. If a path failure is observed during simulation (block 408: YES), the transition probabilities may be unbiased (block 410). As discussed above, the DPFS method may use DTMC, with the target failure ratio α and the failure rates $\beta\lambda_g$, starting from state n=0 until a path failure is observed in the simulation with dynamic path restoration. When a path failure is observed, the bias β may be set to 1, e.g., the group failure rates may returned to their original values.

The network may continue to be simulated with unbiased transition probabilities (block 412). The simulation (block 412) with unbiased transition probabilities may continue if the original state has not been reached (block 414: NO). The original state may be reached, for example, after all group repairs have been made. Because the repair rate may be much higher than the failure rate, a simulation that returns to state n=0 will likely not be impractical in terms of simulation time with an unbiased failure rate. If the original state (n=0) has been reached (block 414: YES) another replication of the simulation of the network may take place (block 404), process 400 may determine whether the simulation is complete (block 416). In one embodiment, rather than continuing the simulation with unbiased transition probabilities, process 400 may re-bias the transition probabilities (e.g., to a lesser extent).

Thus, in one embodiment, DPFS may set the failure rates of the groups at an increased level until path failures are observed using a dynamic path restoration algorithm. In this embodiment, when a path failure occurs in simulation, the failure rates of the groups may be returned to their original unbiased values. In another embodiment, the group failures rates may be biased until a group failure, and then returned to their original values. This latter embodiment, however, may not measure the path availability or path operational time because the failure of a group may not necessarily mean a failure of a path. In another embodiment, after a path fails, the group failure rate may be biased again (e.g., to a lesser extent) rather than returning the failure rate of the group to its original level.

If the simulation is incomplete (block 416: NO), then the simulation process may begin again (block 404). For example, a simulation may be considered incomplete if the confidence interval requirement has not been reached or if the number of replications has not reached a set value. In other words, the simulation process may be repeated independently, starting again from state n=0 and returning to state n=0, until the required number of independent replications have been completed, for example.

As discussed, in one embodiment, biased failure rates may be used until a path failure is observed. If the path availabilities are imbalanced, e.g., if one or more of the paths intrinsically have an order of magnitude or higher availability compared to other paths, then the DPFS method may provide better availability estimates for the lower availability paths than the higher availability paths. This difference may result because the lower availability paths are more likely to fail before turning off the failure biasing in DPFS.

To address this difference, the DPFS method described above may be modified to turn off failure biasing only when a particular path of interest cannot be rerouted. In this embodiment, the failure rate of group g may be set to $\lambda_g$ for 1≤g≤G only when A(i, k)=0 for a particular path i of interest. In this embodiment, a non-zero estimate for A(i) may be generated. This process can be applied individually to all the paths i, 1≤i≤P, in the network to provide a non-zero availability estimate A'(i) for each path.

This embodiment may be implemented by, for example, cycling through paths i, 1≤i≤P, that are considered to be of interest during each independent replication. In one embodiment, the path of interest may be selected adaptively, based on observed confidence interval widths, for example, as the independent replications are carried out. For example, as the independent replications are made, more replications may be devoted to paths that exhibit wider observed confidence intervals.

Exemplary pseudo-code for one embodiment of the DPFS simulation method for a mesh network with dynamic path restoration algorithm R(.) is provided below. In the pseudo-code, the number of independent replications is denoted by I. The estimate of R(i) obtained in replication r is denoted by R'(i,r). The mean estimate of R(i) is denoted by R'(I). The estimate of the availability of path i is denoted by A'(i).

---

Choose target failure rate ratio α.
Set bias β.
For r = 1, . . . , I {
    Set the initial state to n = 0. Set m ≠ 0.
    Initialize the circuits state C(0) and paths state P(0).
    For 1 ≤ g ≤ G: Set failure rate of group g to β $\lambda_g$.
    For 1 ≤ i ≤ P: Set R'(i, r) = 0 and A(i, 0) = 1.
    Set k = 0 and Λ = 1.
    While m ≠ 0 {
        For 1 ≤ i ≤ P: R'(i, r) = R'(i, r) + A(i, k)h(n).
        If A(i, k) = 0 for any i, 1 ≤ i ≤ P:
        For 1 ≤ g ≤ G: Set failure rate of group g to $\lambda_g$.
        Generate a state transition out of state n in the DTMC:
        New state is m.
        Set Λ = Λ p(n, m)/p*(n, m) and k = k + 1.
        Update C(k).
        Update P(k) = R(P(k-1), C(k)).
        For 1 ≤ i ≤ P: Update A(i, k)
    Set n = m.
    }
    For 1 ≤ i ≤ P: R'(i, r) = R'(i, r)Λ.
}

For $1 \leq i \leq P: R'(i) = \sum_{r=1}^{I} R'(i, r)/I.$ $$\text{For } 1 \leq i \leq P: \quad A'(i) = R'(i) \sum_{g=1}^{G} \lambda_g \bigg/ \prod_{g=1}^{G} (1 + \rho_g).$$

Methods and apparatuses disclosed herein may allow for the simulation of communication networks for determining the service availability, including the simulation of mesh networks with dynamic path restoration. With DPFS, the failure rates of the failure equivalence groups of network elements may be biased to increased levels until path failures are observed under a path restoration algorithm of a network. Embodiments disclosed herein may allow for more effective simulation of highly reliable networks by reducing the number of independent replications or iterations that are needed to achieve desired confidence intervals.

In the preceding specification, various preferred embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

For example, embodiments described herein may apply to a mesh network employing dedicated-resource and shared-resource protection schemes, as well as dynamic path restoration. Embodiments described herein may model the availability of a WDM mesh network with multiple back-up paths and link sharing. In one embodiment, the rate of failure and the rate of repair may apply to circuits (e.g., circuits 106) rather than links (e.g., links 104). In such an embodiment, a circuit may be considered a link. In one embodiment, a link may connect two nodes by passing through another node.

While series of blocks have been described above with respect to different processes, the order of the blocks may differ in other implementations. Moreover, non-dependent acts may be performed in parallel.

It will be apparent that aspects of the embodiments, as described above, may be implemented in many different forms of software, firmware, and hardware in the embodiments illustrated in the figures. The actual software code or specialized control hardware used to implement these embodiments is not limiting of the invention. Thus, the operation and behavior of the embodiments of the invention were described without reference to the specific software code—it being understood that software and control hardware may be designed to the embodiments based on the description herein.

Further, certain portions of the invention may be implemented as "logic" that performs one or more functions. This logic may include hardware, such as an application specific integrated circuit, a field programmable gate array, a processor, or a microprocessor, or a combination of hardware and software.

No element, act, or instruction used in the description of the present application should be construed as critical or essential to the invention unless explicitly described as such. Also, as used herein, the articles "a" and the term "one of" are intended to include one or more items. Further, the phrase "based on" is intended to mean "based, at least in part, on" unless explicitly stated otherwise.

What is claimed is:

1. A computer-implemented method comprising:
receiving first transition information indicative of first transition rates associated with a plurality of communication links in a network model, wherein the network model includes a plurality of nodes, the plurality of communication links, and a communication path between a first node and a second node of the plurality of nodes, wherein the communication path uses at least two of the plurality of communication links, and wherein each of the first transition rates indicates a rate that a corresponding communication link transitions from a first state to a second state in the network model during simulation until the network model reaches a first network state;

generating second transition information indicative of biased transition rates, wherein each of the biased transition rates is greater than a corresponding one of the first transition rates, wherein each of the biased transition rates indicates a rate that the corresponding communication link transitions from the first state to the second state in the network model during simulation after the network model reaches the first network state;

simulating the network model until the first network state is reached, wherein the first network state occurs when a transition associated with a first one of the communication links causes the communication path to transition to a different state, wherein at least one of the plurality of communication links remains in the first state as the network model transitions to the first network state, wherein before the simulation of the network model reaches the first network state, the biased transition rates govern transitions from the first state to the second state for each of the plurality of communication links;

continuing simulating the network model from the first network state, wherein after the network model reaches the first network state, the first transition rates govern transitions from the first state to the second state for each of the plurality of communication links; and determining a network model reliability parameter based on the simulation of the network model.

2. The computer-implemented method of claim 1,
wherein the first transition rates indicate failure rates, wherein the first state is an operational state and the second state is a failed state, wherein each failure rate indicates a rate that a corresponding one of the communication links transitions from the operational state to the failed state;

wherein the biased transition rates indicate biased failure rates, wherein each biased failure rate is higher than a corresponding one of the failure rates; and wherein the first network state occurs when failure associated with one of the communication links causes the communication path to fail because the communication path cannot be rerouted using other ones of the communication links not associated with the failure, wherein the at least one of the plurality of communication links remains in the operational state as the network model transitions to the first network state.

3. The computer-implemented method of claim 2,
wherein simulating the network model includes simulating a continuous-time Markov chain (CTMC) or simulating a discrete-time Markov chain (DTMC).

4. The computer-implemented method of claim 2,
wherein the first transition information indicates repair rates, and wherein each repair rate indicates a rate that a corresponding one of the communication links transitions from the failed state to the operational state, and wherein continuing simulating the network model from the first network state includes continuing simulating wherein the transitions from the failed state to the operational state for each of the communication links is governed by the repair rates.

5. The computer-implemented method of claim 4, wherein determining the network model reliability parameter includes determining a proportion of time that the communication path is not in any failed state, an average proportion of time that the communication path is not in any failed state, or an average proportion of time that a set of paths is not in any failed state.

6. The computer-implemented method of claim 4, wherein the failure rates indicate measured or observed failure rates, wherein the repair rates indicate measured or observed repair rates, and wherein the biased failure rates indicate rates at least 100 times above the measured or observed failure rates.

7. The computer-implemented method of claim 1,
wherein the first transition information indicates a first group transition rate of a group of the plurality of communication links, wherein the first group transition rate indicates a rate that the group transitions from the first state to the second state in the network model during simulation until the network model reaches the first network state, and wherein when the group transitions to the second state, then all the communication links in the group transition to the second state; and
wherein generating the second transition information includes biasing the first group transition rate to generate a second group transition rate, wherein the second group transition rate is greater than the first group transition rate, wherein the second group transition rate indicates a rate that the group transitions from the first state to the second state in the network model during simulation after the network model reaches the first network state, and wherein when the group transitions to the second state, then all the communication links in the group transition to the second state.

8. The computer-implemented method of claim 7, wherein when the at least one of the plurality of communication links remains in the first state as the network model transitions to the first network state, transition information governing the at least one of the plurality of communication links remaining in the first state changes from the biased transition rate to the first transition rate.

9. The computer-implemented method of claim 1,
wherein a first communication path includes the communication path between the first node and the second node;
wherein the network model includes a second communication path between a third node and a fourth node, different from the first node and the second node, wherein the second communication path uses at least two of the plurality of communication links;
wherein the first network state occurs when the transition associated with the first one of the communication links causes the first communication path to transition to the different state regardless of a state of the second communication path; and
wherein determining the network model reliability parameter includes determining a communication path reliability parameter.

10. A non-transitory computer-readable medium including computer-executable instructions, the computer-executable instructions including instructions to:
receive first transition data indicative of first transition rates associated with a plurality of communication links in a network model, wherein the network model represents a plurality of nodes, the plurality of communication links, and a communication path between a first node and a second node of the plurality of nodes, and wherein at least two of the communication links carry data for the communication path, wherein each of the first transition rates indicates a rate that the corresponding communication link transitions from a first state to a second state in the network model during simulation before the network model transitions to a first network state;
generate second transition data indicative of biased transition rates, wherein each of the biased transition rates is higher or lower than the first transition rates;
execute the network model until the first network state is reached, wherein the first network state occurs when one of the at least two of the communication links carrying the data for the communication path transitions to the second state and causes the communication path to transition to a different state, wherein before the execution of the network model reaches the first network state, the biased transition rates govern transitions from the first state to the second state for each of the plurality of communication links, and wherein at least one of the plurality of communications links remains in the first state as the network model transitions to the first network state;
continue execution of the network model from the first network state, wherein after the network model reaches the first network state, the first transition rates govern transitions from the first state to the second state for each of the plurality of communication links; and
determine a network model reliability parameter based on the execution of the network model.

11. The non-transitory computer-readable medium of claim 10, wherein the first transition rates include failure rates, wherein the first state is an operational state and the second state is a failed state, wherein each failure rate indicates a rate that the corresponding one of the communication links in the network model transitions from the operational state to the failed state, wherein the medium further including one or more instructions to:
bias the failure rates higher to generate biased failure rates, wherein each biased failure rate is higher than a corresponding one of the failure rates,
wherein the first network state occurs when one of the at least two of the communication links carrying the data for the communication path fails and causes the communication path to fail.

12. The non-transitory computer-readable medium of claim 11, wherein the first transition data indicate repair rates, wherein each repair rate indicates a rate that a corresponding one of the communication links in the network model transitions from the failed state to the operational state, the computer-readable medium further including:
one or more instructions to execute the network model from the first network state wherein the transitions from the failed state to the operational state for each of the communication links is governed by the repair rates.

13. The non-transitory computer-readable medium of claim 12, wherein the failure rates indicate expected, measured, or observed failure rates, wherein the repair rates indicate expected, measured, or observed repair rates, and wherein the biased failure rates indicate rates at least 100 times above the expected, measured, or observed failure rates, the computer-readable medium further including one or more instructions to determine a proportion of time that the communication path is not in any failed state, an average proportion of time that the communication path is not in any failed state, or an average proportion of time that a set of paths is not in any failed state.

14. The non-transitory computer-readable medium of claim 11, wherein executing the network model includes simulating a continuous-time Markov chain (CTMC) or simulating a discrete-time Markov chain (DTMC).

15. The non-transitory computer-readable medium of claim 11, wherein the first transition rates include a group rate of failure of a group of the plurality of communication links, the medium further including one or more instructions to:
bias the group rate to generate a biased group rate; and
simulate the network model until the first network state is reached based on the biased group rate, wherein when the group transitions to a failed state, then all the communication links in the group transition to the failed state.

16. The non-transitory computer-readable medium of claim 15, further including one or more instructions to simulate the network model from the first network state, based on the group rate and not based on the biased group rate, until the communication path is rerouted after the communication path has failed.

17. The non-transitory computer-readable medium of claim 10, wherein a first communication path includes the communication path between the first node and the second node; and
wherein the network model includes a second communication path between a third node and a fourth node, different from the first node and the second node, wherein the second communication path uses at least two of the plurality of communication links;
the medium further including one or more instructions to:
simulate the network model, based on the biased transition rates, until a transition associated with one of the communication links causes the first communication path to transition and regardless of whether a transition associated with one of the communication links causes the second communication path to transition; and
determine a communication path reliability parameter.

18. A system comprising:
a memory to store a network model including first information indicative of first transition rates associated with a plurality of communication links in the network model, wherein the network model includes a plurality of nodes, the plurality of communication links, and a communication path between a first node and a second node of the plurality of nodes, wherein the communication path uses at least two of the communication links, wherein each of the first transition rates indicates a rate that the corresponding communication link transitions from a first state to a second state in the network model during simulation until the network model transitions to a first network state; and
a processor to:
generate second transition data indicative of biased transition rates, wherein each of the biased transition rates is higher or lower than the first transition rates;
execute the network model until the first network state is reached, wherein the first network state occurs when one of the at least two of the communication links carrying the data for the communication path transitions to a different state, wherein before the execution of the network model reaches the first network state, the biased transition rates govern transitions from the first state to the second state for each of the plurality of communication links, and wherein at least one of the plurality of communication links remains in the first state as the network model transitions to the first network state;
continue execution of the network model from the first network state, wherein after the network model reaches the first network state, the first transition rates govern transitions from the first state to the second state for each of the plurality of communication links; and
determine a network model reliability parameter based on the execution of the network model.

19. The system of claim 18, wherein the first transition rates include failure rates, and the processor is further configured to:
bias the failure rates to generate biased failure rates, wherein each biased failure rate is higher than a corresponding one of the failure rates; and
execute the network model, based on the biased failure rates, until the first network state is reached, wherein the first network state occurs when one of the at least two of the communication links carrying the data for the communication path fails and the communication path cannot be rerouted using other ones of the communication links not associated with failure.

20. The system of claim 19, wherein the first information indicates rates of repair, wherein each rate of repair indicates a rate that a corresponding one of the communication links transitions from a failed state to an operational state, and wherein the processor is further configured to execute the network model from the first network state based on the failure rates and the rates of repair and not based on the biased failure rates, until the communication path is rerouted using other ones of the communication links not associated with failure.

21. The system of claim 20, wherein the failure rates indicate expected, measured, or observed failure rates, wherein the rates of repair indicate expected, measured, or observed repair rates, and wherein the biased failure rates indicate rates at least 100 times above the expected, measured, or observed failure rates.

22. The system of claim 19, where the processor is further configured to determine a proportion of time that the communication path is not in any failed state, an average proportion of time that the communication path is not in any failed state, or an average proportion of time that a set of paths is not in any failed state.

23. The system of claim 19, where the processor is further configured to execute the network model as a continuous-time Markov chain (CTMC) or a discrete-time Markov chain (DTMC).

24. The system of claim 18,
wherein the memory further stores a group transition rate of a group of the plurality of communication links;
wherein the processor is further configured to:
bias the group transition rate to generate a biased group transition rate; and
execute the network model based on the biased group transition rate until the first network state is reached, wherein when the group of links transition to a different state, then all the links in the group of links transition to the different state.

25. The system of claim 24, wherein the processor is further configured to execute the network model from the first network state based on the group transition rate and not based on the biased group transition rate.

* * * * *